(12) United States Patent
Yang et al.

(10) Patent No.: US 7,136,628 B2
(45) Date of Patent: Nov. 14, 2006

(54) ADAPTIVE DIGITAL PREDISTORTION METHOD AND APPARATUS FOR WIRELESS TRANSMITTER

(75) Inventors: Zhengjun Yang, Shen Zhen (CN); Honghui Yan, Shen Zhen (CN)

(73) Assignee: Huawei Technologies Co., Ltd., Shen Zhen (CN)

( * ) Notice: Subject to any disclaimer, the term of this patent is extended or adjusted under 35 U.S.C. 154(b) by 384 days.

(21) Appl. No.: 10/340,984

(22) Filed: Jan. 13, 2003

(65) Prior Publication Data

US 2003/0104794 A1   Jun. 5, 2003

Related U.S. Application Data

(63) Continuation of application No. PCT/CN01/01186, filed on Jul. 20, 2001.

(30) Foreign Application Priority Data

Jul. 20, 2000   (CN) ................................ 00 1 19493

(51) Int. Cl.
*H04B 1/04* (2006.01)
*H03F 1/26* (2006.01)
*H04K 1/02* (2006.01)

(52) U.S. Cl. .................. 455/114.3; 455/126; 455/63.1; 375/296; 375/297; 330/149

(58) Field of Classification Search ............... 455/126, 455/114.3, 63.1, 67.13; 375/296, 297; 330/149; 332/107, 123, 159
See application file for complete search history.

(56) References Cited

U.S. PATENT DOCUMENTS 5,103,459 A * 4/1992 Gilhousen et al. .......... 370/206
5,524,286 A    6/1996 Chiesa et al.
5,732,333 A * 3/1998 Cox et al. .................. 455/126
5,900,778 A * 5/1999 Stonick et al. .............. 330/149
6,072,364 A * 6/2000 Jeckeln et al. .............. 330/149
6,081,158 A    6/2000 Twitchell et al.
6,600,792 B1 * 7/2003 Antonio et al. ............. 375/297

FOREIGN PATENT DOCUMENTS

EP   1 011 192 A2   6/2000

* cited by examiner

*Primary Examiner*—Duc M Nguyen
(74) *Attorney, Agent, or Firm*—Dorsey& Whitney LLP

(57) ABSTRACT

An adaptive digital predistortion apparatus and method for transmitting broadband digital signals from a wireless transmitter to a transmitting channel are provided. In the adaptive digital predistortion process, a non-linearity conversion opposite to the transmitting channel characteristic is performed by a digital predistorter for input baseband signals. The predistorted signals are amplified by a power amplifier via an up conversion channel. A part of the signals outputted from the power amplifier are fed back to an adaptive controller via a coupler. The feedback signals are processed by the adaptive controller to obtain out-of-band emission energy of the feedback signals. Using the out-of-band emission energy as a target function, the predistortion parameters are updated by employing a multi-parameter optimum seeking module. Accordingly, broadband signals to be transmitted are predistorted by the digital predistortion system to cancel out the non-linear characteristic of the transmitting channels, and to suppress the out-of-band emission energy of the outputting signals. Meanwhile, by using a multi-parameter optimization seeking module, the predistortion parameters are adjusted adaptively by the digital predistortion system based on the slow variation of non-linearity of the transmitting channels.

5 Claims, 4 Drawing Sheets

ADAPTIVE DIGITAL PREDISTORTION METHOD AND APPARATUS FOR WIRELESS TRANSMITTER

CROSS-REFERENCE TO RELATED APPLICATION

This utility patent application is a continuation application and claims priority of the PCT International Patent Application, serial number PCT/CN01/01186, filed on Jul. 20, 2001, which claims the priority of the Chinese patent application, serial number CN 00119493.3, filed on Jul. 20, 2000; subject matter of which are incorporated herewith by reference.

FIELD OF THE INVENTION

The present invention relates to various wireless transmitters of communication systems that improve system linearity characteristics. More particularly, the present invention relates to an adaptive digital predistortion method and apparatus of the wireless transmitters.

BACKGROUND OF THE INVENTION

In recent years, while wireless communication technology has been developed vigorously worldwide, the wireless communication industry faces a series of problems that are difficult to solve, such as various communication systems existing simultaneously, various communication standards competing sharply, and shorting of wireless frequency resources, and the like. In order to help solve these problems, it is desired that digitalization of a wireless communication system may be as close to Radio Frequency (RF) front end as possible. Also, it is desired that the fundamental function elements of various wireless communications are implemented by software because modifying only the system software would make the supporting of the other communication systems easily. These features have become a necessity of wireless communication systems, particularly involving in broadband wireless communication systems. Further, in broadband wireless communication systems, it is also desired to have super linearity and wide dynamic range in broadband transmitting channels.

In order to utilize frequency resources more effectively, modulation methods with high utilization efficiency of the frequency spectrum, such as SSB, QPSK, 8PSK, and etc., are employed by many communication systems. Not only is the phase of a carrier modulated by these modulation methods, but also the amplitude of the carrier is modulated by these modulation methods. Therefore, non-constant envelope modulation signals with a larger peak to average ratio are produced by these modulation methods. However, for the constant envelope modulation, such as GMSK, if multi-carrier technology is used, a larger envelope fluctuation may also be produced by utilizing a signal combiner to combine the signals of a plurality of carriers into a broadband signal. A higher linearity requirement may be raised for broadband transmitting channels with a larger peak to average ratio, particularly, for digital to analogue (D/A) converters, broadband transmitters (BTXs) and broadband power amplifiers. Generally, semiconductor devices have an unavoidable non-linearity characteristic. When a broadband transmitter is operating at a non-linear region, it will produce an inter-modulation component, thereby causing signals interfering with each other in-band.

As discussed earlier, it is commonly desired to improve communication system linearity in a broadband communication system. Three methods have been used to solve the linearity problems. One is to use a suitable super linear semiconductor device and to design a broadband transmitter that accords with the performance requirements of the super linear semiconductor device. However, this method is expensive and involves many technology difficulties. The second method is to reduce the power of the entire transmitting channel, such that the transmitting channel may operate in a linear region. However, this method significantly decreases the operating efficiency of the broadband communication system. The third method is to employ a linearization technology, that is, proper peripheral circuits are used to correct the non-linearity of the transmitting channel, thereby presenting a linear amplifying effect for the input signals by the circuits in its entirety. This method may avoid using difficult technology for manufacturing semiconductor devices and allows the use of devices with relatively low cost. In addition, this method not only allows a variety of forms, but also provides flexibility in selecting devices. Thus, the third method has been considered as the most suitable method at present.

In a linearization method, predistortion technology is the most simple and effective method. In a predistortion system, signals are corrected firstly by a predistorter, then sent to a power amplifier for amplifying and outputting. The signal distortion characteristic produced by the predistorter is opposite to that produced by a transmitting channel, thereby a distortion component of the transmitting channel is canceled out so as to obtain a non-distortion output.

A typical narrow band predistortion system is shown in FIG. 1. The baseband signals are corrected by a predistorter first. Then, the signals are quadrature modulated, D/A converted by a D/A converter, up-converted by an up-converter, amplified by a power amplifier, and finally outputted by an antenna. Meanwhile, a part of the signals outputted from the power amplifier are fed back by a coupler and converted into baseband signals through a band-pass filter (not shown), down-converted by a down-converter, A/D converted by an A/D converter, demodulated by a quadrature demodulator (not shown), and sent to an error processor. The other input of the error processor is a delayed baseband input signal. The difference between the two signals are compared in the error processor to output a signal to the predistorter. The parameters of the predistorter are updated. An adaptive function can be realized in the error processor. However, in the broadband communication systems, the delay of a frequency component of different signals on the transmitting channels cannot be approximated to the same value. Comparing the differences between the input signals and output signals with a simple delay is not suitable for solving the non-linearity problem of the transmitting channels of the broadband communication systems. Thus, there is a need for a predistortion apparatus and method for compensating the non-linearity of transmitting channels of broadband communication systems.

SUMMARY OF THE INVENTION

One of the objectives of the present invention is to overcome the disadvantages involved in non-linearity of transmitting channels in prior broadband communication systems. The present invention provides an adaptive digital predistortion apparatus and method for properly compensating the non-linearity of the transmitting channels of a broadband base station.

The present invention employs a multi-parameter optimization module to adjust predistortion parameters adaptively. The transmitted signals are predistorted such that the non-linearity characteristic of the non-linear transmitting channels is canceled out for suppressing the out-of-band transmission of output signals.

In one embodiment of the present invention, an adaptive digital predistortion apparatus for wireless transmitters, includes: a modulator, a digital predistorter, a predistortion parameter adaptive controller, a digital to analogue (D/A) converter, an up-converter, a power amplifier, a local oscillator, a down converter, an analogue to digital (A/D) converter, and an antenna. Broadband digital signals for transmitting are input to the digital predistorter and processed by the digital predistorter to generate predistorted signals. The predistorted signals are converted by the D/A converter and then by the up-converter, amplified by the power amplifier, and finally transmitted out by the antenna. Meanwhile, a part of the signals outputted from the power amplifier are fed back by a coupler to a feedback loop wherein the feedback signals are input to a predistortion parameter adaptive controller via the down-converter and the A/D converter. The feedback sampling signals are then processed digitally by the predistortion parameter adaptive controller, whereby out-of-band energy emission of the feedback signal is used as a target function, and predistortion parameters are adjusted adaptively by employing a multi-parameter optimization process so as to allow the entire transmitting channel of the broadband transmission system to maintain a linear transfer characteristic.

In one embodiment of the adaptive digital predistortion apparatus as described above, the predistortion parameter adaptive controller includes a power spectrum estimation module and an adaptive method module. The signals outputted from the A/D converter are transferred to the power spectrum estimation module to estimate the power spectrum. Then, the signals are transferred to the adaptive method module to perform adaptive adjustment before they are transferred to the predistorter.

The present invention also provides an adaptive digital predistortion method for wireless transmitters. The method includes the steps of:

a) performing a non-linearity conversion opposite to transmitting channel characteristic by a digital predistorter for input baseband signals;

b) amplifying the predistorted signals by a power amplifier via an up-converter;

c) feeding back a part of the signals outputted from the power amplifier to an adaptive controller via a coupler;

d) performing digital signal processing by the adaptive controller for the feedback signals to obtain out-of-band emission energy of the feedback signals; and e) updating predistortion parameters by employing a multi-parameter optimum seeking module that uses the out-of-band emission energy as a target function.

Further in one embodiment of the above method, the target function in step e) includes the step of using out-of-band emission energy of the feedback signals as a target function of a predistortion parameter optimization adaptive process.

Still in one embodiment of the above method, N parameters of the digital predistorter are used as factors of the target function. When the target function takes a minimum value, the values of the respective factors are taken as the optimum values of the predistortion parameters.

Yet in one embodiment of the above method, the step of employing multi-parameter optimum seeking module to update the predistortion parameters in step e) includes the steps of:

1) selecting optionally N+1 initial points in a N-dimension, of which the coordinates are used as N parameters of the digital predistorter, when these parameters are taken by the predistorter, out-of-band emission energy of the corresponding feedback signals are measured, respectively;

2) determining an optimum point, a worst point, and a second worse point among N+1 points based on measured values of the out-of-band emission energy;

3) referencing all of the points except the worst point as reflection points of the worst point;

4) measuring a target function value corresponding to each of the reflection points, if the target function value corresponding to one of the reflection points is larger than the target function value corresponding to the second worse point, then turning back and compressing the one of the reflection points from an original reflection direction;

5) determining whether the target function value of the compressed reflection point is still lager than the target function value corresponding to the second worse point, if so, decreasing distances between the optimum point and all of the points except the optimum point by one half; and 6) proceeding step 2) to adjust the predistortion parameters continuously.

BRIEF DESCRIPTION OF THE DRAWINGS

The specific characteristic performances of the present invention will be further described by the following embodiments in conjunction with the drawings.

DETAILED DESCRIPTION OF THE PREFERRED EMBODIMENTS

Figure 1:
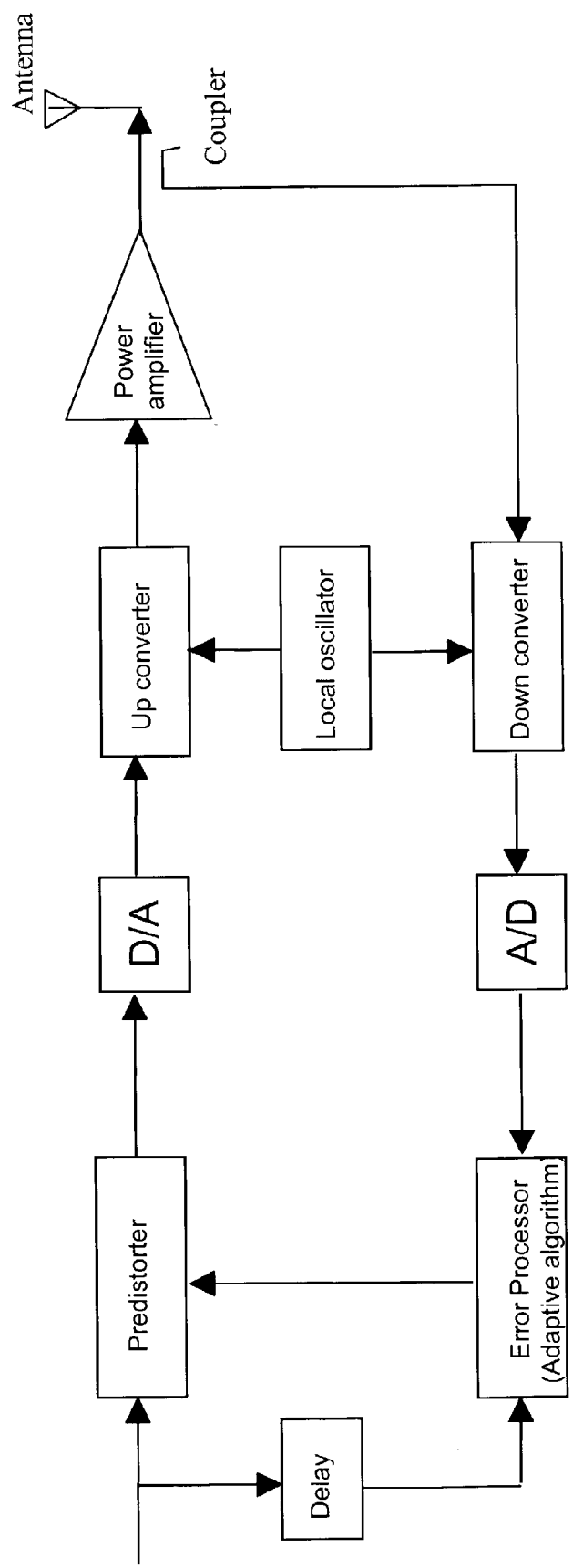
FIG. 1 is a block diagram of a prior art narrow band predistortion apparatus.
Figure 2:
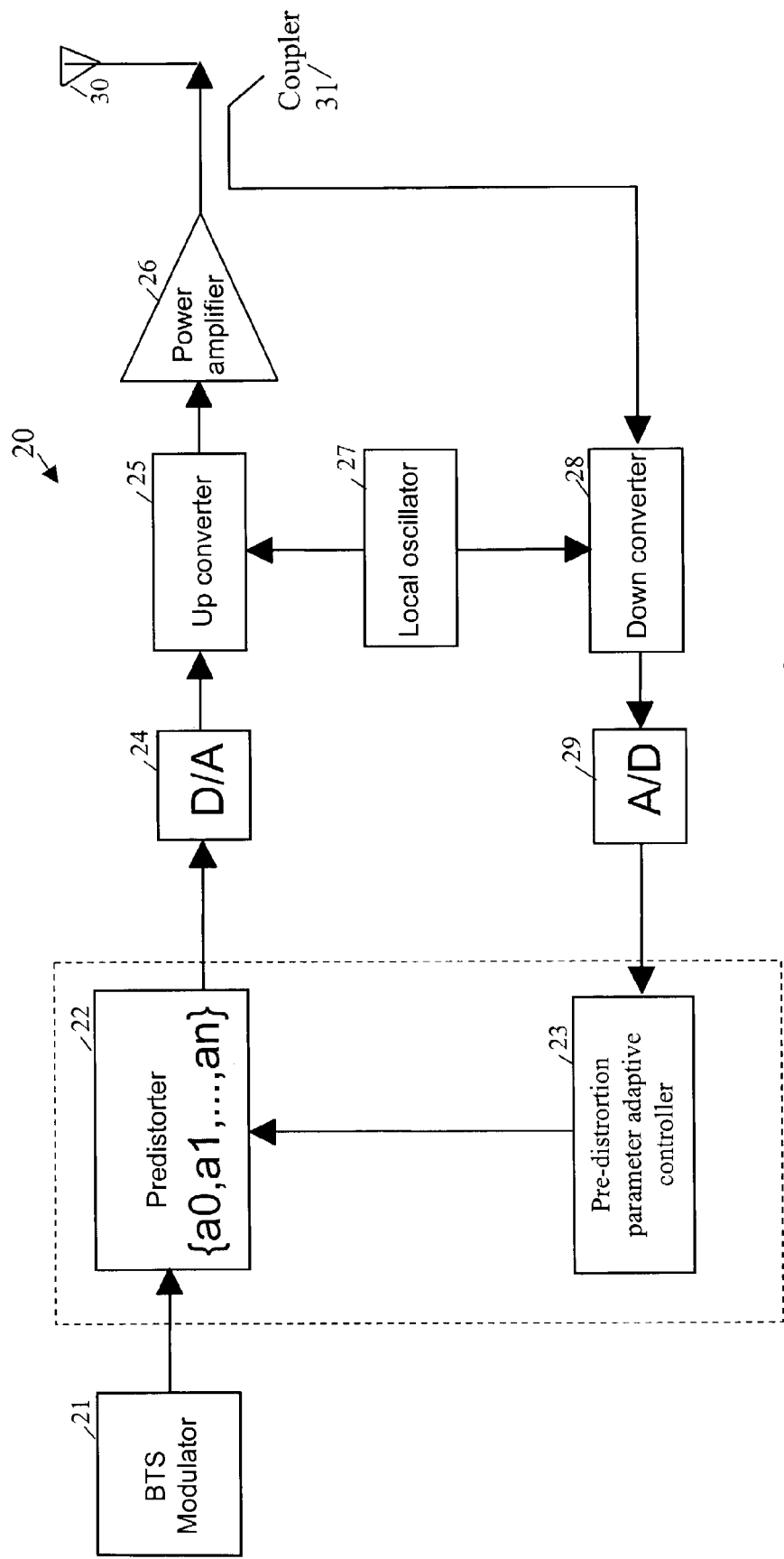
FIG. 2 is a block diagram of one embodiment of an adaptive digital predistortion apparatus for a wireless transmitter in accordance with the principles of the present invention.

In FIG. 2, one embodiment of an adaptive digital predistortion apparatus 20 for a wireless transmitter in accordance with the principles of the present invention includes a base transceiver station (BTS) modulator 21, a digital predistorter 22, a pre-distortion parameter adaptive controller 23, a digital to analogue (D/A) converter 24, an up converter 25, a power amplifier 26, a local oscillator 27, a down converter 28, an analogue to digital (A/D) converter 29, and an antenna 30. Broadband digital signals outputted from a regulator (not shown) for transmitting are input to the digital predistorter 22. The signals are processed by the digital predistorter 22, and the predistorted signals are then sent to the D/A converter 24, the up-converter 25 for conversion. The converted signals are then amplified by the power amplifier 26 and transmitted by the antenna 30. The digital predistortion is a non-linearity conversion process. Under an ideal condition, the non-linearity characteristic of the digital predistortion is opposite to the non-linearity of a transmitting channel, whereby the output signals and the input signals have a linear relation, which indicates a minimum of out-of-band energy emission.

The non-linearity characteristic of the transmitting channel varies according to the operating conditions and the environment parameters. It is required that the parameters of the digital predistorter be updated adaptively. As shown in FIG. 2, a part of the signals outputted from the power amplifier 26 are fed back by a coupler 31 to be input to the predistortion parameter adaptive controller 23 via the down converter 28 and the A/D converter 29. The feedback signal is processed digitally by the controller 23, wherein the out-of-band energy emission of the feedback signal is used as a target function, and the predistortion parameters are adjusted adaptively by employing a multi-parameter optimization process to allow the entire transmitting channel to maintain a linear transfer characteristic.

Figure 3:
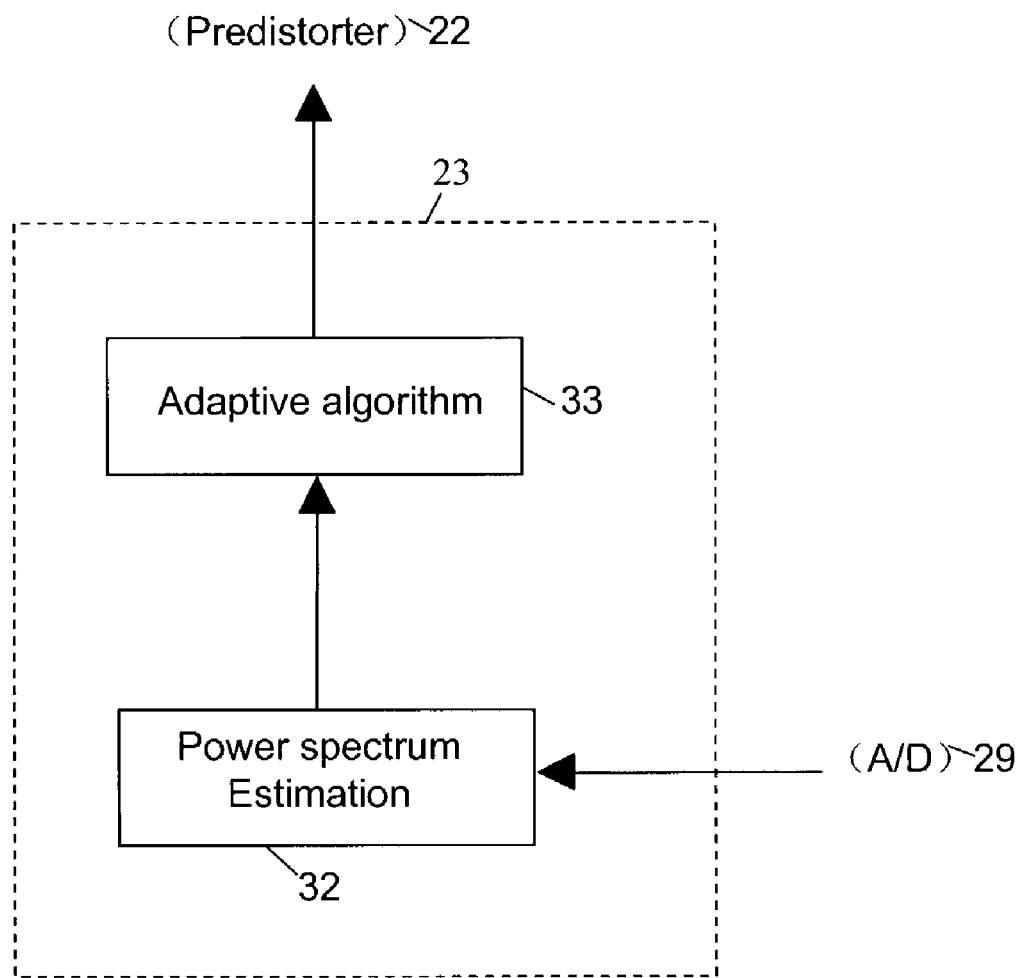
FIG. 3 is a block diagram of one embodiment of a pre-distortion parameter adaptive controller in accordance with the principles of the present invention.

FIG. 3 is a block diagram of one embodiment of the pre-distortion parameter adaptive controller 23 in accordance with the principles of the present invention. The controller 23 includes a power spectrum estimation module 32 and an adaptive method module 33. The signals outputted from the A/D converter 29 are transferred to the power spectrum estimation module 32 to estimate the power spectrum. Then, the signals are transferred to the adaptive method module 33 to perform adaptive adjustment before they are transferred to the digital predistorter 22. A non-linearity conversion opposite to the characteristic of the transmitting channel is performed by the digital predistorter 22 for the input digital signals. The transfer characteristic of the digital predistorter 22 is determined by a set of predistortion parameters $\{a_0, a_1, \ldots, a_N\}$. The predistortion parameters may be factors of a certain function, or may be values taken from the items of a Look Up Table (LUT). The digital predistorter 22 receives periodically the predistortion parameter updating signals sent from the predistortion parameter adaptive controller 23 and modifies the predistortion parameters accordingly.

An adaptive digital predistortion method of the wireless transmitter of the present invention includes the following steps:

a) performing a non-linearity conversion opposite to transmitting channel characteristic by a digital predistorter for input baseband signals;

b) amplifying the predistorted signals by a power amplifier via an up-converter;

c) feeding back a part of the signals outputted from the power amplifier to an adaptive controller via a coupler;

d) performing digital signal processing by the adaptive controller for the feedback signals to obtain out-of-band emission energy of the feedback signals; and e) updating predistortion parameters by employing a multi-parameter optimum seeking module that uses the out-of-band emission energy as a target function. The target function refers to using out-of-band emission energy of the feedback signals as a target function of the predistortion parameter optimization adaptive process.

Figure 4:
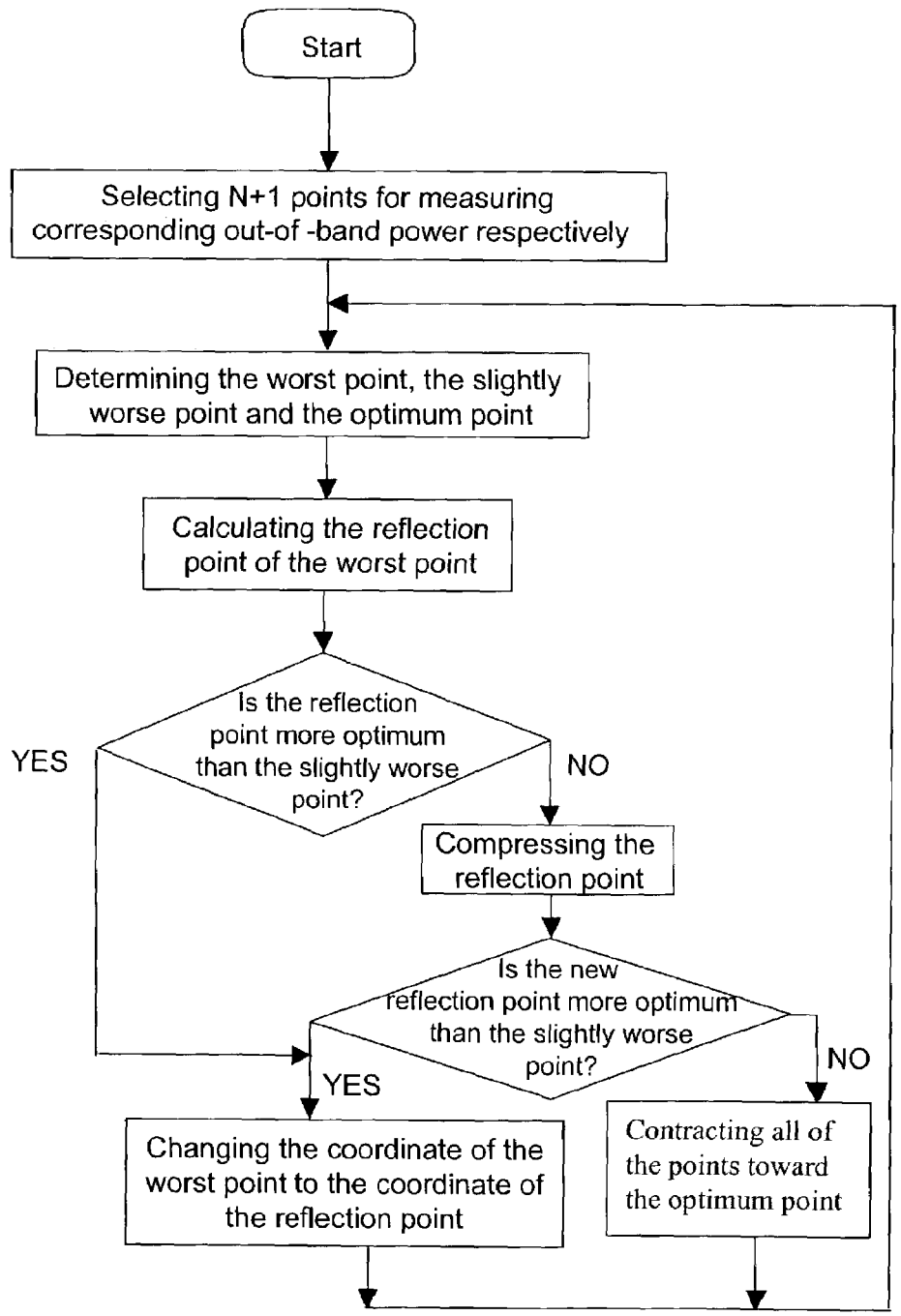
FIG. 4 is a flow chart of one embodiment of an adaptive digital predistortion method for a wireless transmitter in accordance with the principles of the present invention.

FIG. 4 is a flow chart of one embodiment of an adaptive digital predistortion method for a wireless transmitter in accordance with the principles of the present invention. The adaptive digital predistortion method includes a predistortion parameter adjustment or iteration process which seeks optimum values of the predistortion parameters. As an example, assuming that the digital predistorter 23 has N+1 parameters which are denoted as $\{a_0, a_1, \ldots, a_N\}$, the N+1 parameter values can be considered as the coordinates of point X in a N+1 dimension. The out-of-band energy emission of the feedback signals are considered as the target function of the iteration, and the purpose of the predistortion parameter optimization adaptive process is to obtain the optimum values of the predistortion parameters, $\{a_0, a_1, \ldots, a_N\}$, which allows the value of the target function to be the lowest.

The adaptive predistortion parameter adjustment or iteration process includes the steps of:

1) selecting N+1 initial points $X_0, X_1, \ldots, X_N$, to determine values of the target function of the N+1 points, that is, the N+1 dimension coordinates of N+1 points are used as the predistortion parameters of the digital predistorter to measure the out-of-band emission energy of the corresponding feedback signals, respectively;

2) comparing the corresponding values of the target function of the respective points, setting point $X_H$ as the worst point (i.e., the value of the target function corresponding to point $X_H$ is the highest, indicated by $F_H$); setting point $X_B$ as a slightly worse or the second worst point (i.e., the value of the target function corresponding to point $X_B$ is slightly lower than $X_H$, but higher than the other points, indicated by $F_B$); setting point $X_L$ as the best point (i.e., the value of the target function corresponding to point $X_L$ is the lowest, indicated by $F_L$). Then, a reflection is made to point $X_H$ with respect to all of the other points to obtain a new point $X_R$, the formula is as follows:

$$X_R = 2X_C - X_H$$

wherein $$X_C = \left(\sum_{i=0}^{N} X_i - X_H\right) / N$$

3) calculating the value of the target function corresponding to point $X_R$, indicated by $F_R$. If $F_R$ is higher than the value of the target function corresponding to $X_B$, which indicates that the point $X_R$ is taken too far, and a compression is required, that is, the point will be returned back slightly at the connection direction of $X_H$ and $X_R$ to obtain a new reflection point $X_R$. The specific formula is as follows:

$$X_R = (1-\lambda)X_H + \lambda X_R$$

wherein, $\lambda$ is a compression factor and is a constant between 0~1. To prevent the new reflection point from superimposing on point $X_C$, $\lambda$ cannot be equal to 0.5. The superimposition of $X_R$ and $X_C$ will decrease the number of dimension which is detrimental to converging the iteration process to an optimum solution.

4) after compressing, if the value of the target function $F_R$ corresponding to new point $X_R$ is still higher than the value of the target function $F_B$ corresponding to point $X_B$, then decreasing the distances of all of the points including the optimum point $X_L$ by one half, and proceeding to step 2). The specific formula is as follows:

$$X_i = (X_L + X_i)/2. \text{ wherein } i=1, 2, \ldots, N$$

5) after compressing, if the value of the target function $F_R$ corresponding to new point $X_R$ is no longer higher than the value of the target function $F_B$ corresponding to point $X_B$, then substituting the worst point $X_H$ by the new point $X_R$, and proceeding to step 2) to iterate continuously.

APPLICABILITY IN INDUSTRIES

The present invention can be used suitably for adaptive digital predistortion systems of broadband wireless transmitters. The signals to be transmitted are predistorted to cancel out the non-linear characteristic of non-linear transmitting channels and to suppress the out-of-band emission of the outputting signals. Meanwhile, by using a multi-parameter optimization process, the predistortion parameters can be adjusted adaptively by the predistortion system based on the slow variation of the non-linearity of the transmitting channels.

From the above description and drawings, it will be understood by those of ordinary skill in the art that the particular embodiments shown and described are for purposes of illustration only and are not intended to limit the scope of the present invention. Those of ordinary skill in the art will recognize that the present invention may be embodied in other specific forms without departing from its spirit or essential characteristics. References to details of particular embodiments are not intended to limit the scope of the invention.

What is claimed is:

1. An adaptive digital predistortion apparatus for transmitting broadband digital signals from a wireless transmitter to a transmitting channel, comprising:
    a modulator for modulating broadband digital signals;
    a predistorter coupled to the modulator for receiving and predistorting modulated signals;
    a digital to analogue (D/A) converter coupled to the predistorter for receiving and converting predistorted signals from the predistorter;
    an up converter coupled to the D/A converter for receiving and converting converted signals from the D/A converter;
    a power amplifier coupled to the up converter for receiving and amplifying up converted signals from the up converter;
    an antenna coupled to the power amplifier for receiving and transmitting amplified signals from the power amplifier;
    a down converter coupled to the power amplifier for receiving and feeding back a part of the amplified signals from the power amplifier;
    a local oscillator coupled between the up converter and the down converter for providing oscillation signals to the up converter and the down converter;
    an analogue to digital (A/D) converter coupled to the down converter for receiving and converting converted feedback signals from the down converter;
    a predistortion parameter adaptive controller coupled to the A/D converter and to the predistorter for receiving the converted feedback signals from the A/D converter and adaptively adjusted predistortion parameters of the predistorter and sending the adjusted predistortion parameters to the predistorter;
    wherein the broadband digital signals to be transmitted are input to the digital predistorter and processed by the digital predistorter, then converted by the D/A converter and the up converter, then amplified by the power amplifier and transmitted by the antenna; and meanwhile, a part of the amplified signals outputted from the power amplifier are fed back to a feedback loop, in which the feedback signals are down converted by the down converter and converted by the A/D converter, and processed by the predistortion parameter adaptive controller;
    wherein out-of-band energy emission of the feedback signals are used as a target function, and the predistortion parameters are adjusted adaptively by employing a multi-parameter optimization process to allow the transmitting channel to maintain a linear transfer characteristic, the step of employing the multi-parameter optimization process computes the parameters randomly in a predetermined range which comprises the steps of:
        selecting optionally N+1 initial points in N-dimension, of which coordinates are used as N parameters of the digital predistorter, when the N parameters are processed by the predistorter, the out-of-band emission energy of the corresponding feedback signals are measured, respectively;
        determining an optimum point, a worst point, and a second worse point among N+1 points based on measured values of the out-of-band emission energy;
    referencing all of the points except the worst point as reflection points of the worst point;
    measuring a target function value corresponding to each of the reflection points, if the target function value corresponding to one of the reflection points is larger than the target function value corresponding to the second worse point, then turning back and compressing the one of the reflection points from an original reflection direction;
        determining whether the target function value of the compressed reflection point is still lager than the target function value corresponding to the second worse point, if so, decreasing distances between the optimum point and all of the points except the optimum point by one half; and
        proceeding the determining step to adjust the predistortion parameters continuously.

2. The adaptive digital predistortion apparatus of claim 1, wherein the predistortion parameter adaptive controller comprises a power spectrum estimation module and an adaptive method module, the signals outputted from the A/D converter are sent to the power spectrum estimation module to estimate power spectrum, and to the adaptive method module to perform adaptive adjustment of predistortion parameters to be sent to the predistorter.

3. An adaptive digital predistortion method for transmitting broadband digital signals from a wireless transmitter to a transmitting channel, comprising the steps of:
    a) performing a non-linearity conversion opposite to non-linearity characteristic of the transmitting channel by a digital predistorter for the broadband digital signals, the digital predistorter having a set of predistortion parameters;
    b) amplifying predistorted signals by a power amplifier via an up conversion channel;
    c) feeding back a part of amplified signals outputted from the power amplifier to an adaptive controller via a coupler;
    d) processing the feedback signals by the adaptive controller to obtain out-of-band emission energy of the feedback signals; and
    e) updating the predistortion parameters by employing a multi-parameter optimum seeking module using the out-of-band emission energy as a target function, wherein the step e) computes the parameters randomly in a predetermined range which comprises the steps of:
        1) selecting optionally N+1 initial points in N-dimension, of which coordinates are used as N parameters of the digital predistorter, when the N parameters are processed by the predistorter, the out-of-band emission energy of the corresponding feedback signals are measured, respectively;

2) determining an optimum point, a worst point, and a second worse point among N+1 points based on measured values of the out-of-band emission energy;

3) referencing all of the points except the worst point as reflection points of the worst point;

4) measuring a target function value corresponding to each of the reflection points, if the target function value corresponding to one of the reflection points is larger than the target function value corresponding to the second worse point, then turning back and compressing the one of the reflection points from an original reflection direction;

5) determining whether the target function value of the compressed reflection point is still lager than the target function value corresponding to the second worse point, if so, decreasing distances between the optimum point and all of the points except the optimum point by one half; and 6) proceeding step 2) to adjust the predistortion parameters continuously.

4. The method of claim 3, wherein the using of out-of-band emission energy as the target function in step e) includes using the out-of-band emission energy of the feedback signals as the target function of a predistortion parameter optimization adaptive process.

5. The method of claim 3, wherein the step of updating includes using the predistortion parameters of the digital predistorter as factors of the target function, when value of the target function is a minimum value, values of the respective factors are optimum values of the predistortion parameters.

* * * * *